US011355470B2

(12) United States Patent
Ryu et al.

(10) Patent No.: US 11,355,470 B2
(45) Date of Patent: Jun. 7, 2022

(54) SEMICONDUCTOR DEVICE AND METHODS OF MANUFACTURING SEMICONDUCTOR DEVICES

(71) Applicant: Amkor Technology Singapore Holding Pte. Ltd, Valley Point (SG)

(72) Inventors: Ji Yeon Ryu, Incheon (KR); Jae Beom Shim, Incheon (KR); Tae Yong Lee, Gyeonggi-do (KR); Byong Jin Kim, Seoul (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 67 days.

(21) Appl. No.: 16/802,614

(22) Filed: Feb. 27, 2020

(65) Prior Publication Data

US 2021/0272923 A1 Sep. 2, 2021

(51) Int. Cl.
*H01L 23/00* (2006.01)
*H01L 23/31* (2006.01)
*H01L 23/367* (2006.01)
*H01L 21/48* (2006.01)
*H01L 21/56* (2006.01)
*H01L 23/492* (2006.01)
*H01L 23/433* (2006.01)
*H01L 23/495* (2006.01)

(52) U.S. Cl.
CPC .......... *H01L 24/40* (2013.01); *H01L 21/4875* (2013.01); *H01L 21/565* (2013.01); *H01L 23/3107* (2013.01); *H01L 23/3135* (2013.01); *H01L 23/367* (2013.01); *H01L 23/4334* (2013.01); *H01L 23/492* (2013.01); *H01L 23/4951* (2013.01); *H01L 2224/40247* (2013.01)

(58) Field of Classification Search
CPC ......... H01L 21/4871–4882; H01L 21/56–568; H01L 23/31–3192; H01L 23/36–3738; H01L 23/42–4338; H01L 23/488–49894; H01L 24/00; H01L 24/24; H01L 24/80; H01L 2224/40247
See application file for complete search history.

(56) References Cited

U.S. PATENT DOCUMENTS

| | | | |
|---|---|---|---|
| 6,081,031 A | 6/2000 | Letterman et al. | |
| 6,362,087 B1 | 3/2002 | Wang et al. | |
| 6,667,546 B2 * | 12/2003 | Huang | H01L 23/552 257/691 |
| 6,767,820 B2 | 7/2004 | Standing et al. | |

(Continued)

*Primary Examiner* — Andres Munoz
(74) *Attorney, Agent, or Firm* — Kevin B. Jackson

(57) ABSTRACT

In one example, a semiconductor device comprises an electronic component comprising a component face side, a component base side, a component lateral side connecting the component face side to the component base side, and a component port adjacent to the component face side, wherein the component port comprises a component port face. A clip structure comprises a first clip pad, a second clip pad, a first clip leg connecting the first clip pad to the second clip pad, and a first clip face. An encapsulant covers portions of the electronic component and the clip structure. The encapsulant comprises an encapsulant face, the first clip pad is coupled to the electronic component, and the component port face and the first clip face are exposed from the encapsulant face. Other examples and related methods are also disclosed herein.

16 Claims, 11 Drawing Sheets

(56) References Cited

U.S. PATENT DOCUMENTS

| | | | | |
|---|---|---|---|---|
| 6,836,009 B2* | 12/2004 | Koon | H01L 25/03 | |
| | | | 257/692 | |
| 6,890,845 B2 | 5/2005 | Standing et al. | | |
| 6,992,385 B2* | 1/2006 | Satou | H01L 24/40 | |
| | | | 257/735 | |
| 7,049,684 B2* | 5/2006 | Minamio | H01L 21/565 | |
| | | | 257/666 | |
| 7,138,707 B1* | 11/2006 | Lee | H01L 21/568 | |
| | | | 257/684 | |
| 7,253,090 B2 | 8/2007 | Standing et al. | | |
| 7,385,299 B2* | 6/2008 | Chow | H01L 24/73 | |
| | | | 257/787 | |
| 7,449,771 B1 | 11/2008 | Fan | | |
| 7,598,603 B2* | 10/2009 | Otremba | H01L 24/73 | |
| | | | 257/675 | |
| 7,768,125 B2* | 8/2010 | Chow | H01L 23/49816 | |
| | | | 257/738 | |
| 8,076,761 B1* | 12/2011 | Long | H01L 23/495 | |
| | | | 257/666 | |
| 8,114,710 B2* | 2/2012 | Muto | H01L 24/33 | |
| | | | 438/118 | |
| 8,319,323 B2* | 11/2012 | Letterman, Jr. | H01L 23/49575 | |
| | | | 257/678 | |
| 8,395,251 B2* | 3/2013 | Shim | H01L 23/49555 | |
| | | | 257/686 | |
| 8,736,042 B2* | 5/2014 | Li | H01L 23/49562 | |
| | | | 257/692 | |
| 9,281,284 B2* | 3/2016 | Yap | H01L 21/52 | |
| 9,385,070 B2* | 7/2016 | Tsai | H01L 25/18 | |
| 9,589,868 B2* | 3/2017 | McKnight-MacNeil | H01L 23/49575 | |
| 10,211,071 B2* | 2/2019 | Ho | H01L 21/561 | |
| 10,438,873 B2* | 10/2019 | Choi | H01L 23/4951 | |
| 10,629,519 B2* | 4/2020 | Chen | H01L 23/492 | |
| 2003/0038347 A1* | 2/2003 | Chiu | H01L 25/105 | |
| | | | 257/678 | |
| 2003/0089983 A1* | 5/2003 | Huang | H01L 24/73 | |
| | | | 257/738 | |
| 2004/0026773 A1* | 2/2004 | Koon | H01L 23/3114 | |
| | | | 257/692 | |
| 2004/0038509 A1* | 2/2004 | Standing | H01L 23/492 | |
| | | | 438/612 | |
| 2004/0089921 A1* | 5/2004 | Minamio | H01L 23/49575 | |
| | | | 257/666 | |
| 2004/0169289 A1* | 9/2004 | Satou | H01L 24/40 | |
| | | | 257/780 | |
| 2007/0045785 A1* | 3/2007 | Noquil | H01L 23/49562 | |
| | | | 257/666 | |
| 2007/0108568 A1* | 5/2007 | Shim | H01L 23/49555 | |
| | | | 257/676 | |
| 2007/0158809 A1* | 7/2007 | Chow | H01L 25/0652 | |
| | | | 257/686 | |
| 2007/0200257 A1* | 8/2007 | Chow | H01L 21/568 | |
| | | | 257/787 | |
| 2007/0202680 A1* | 8/2007 | Ismail | H01L 24/13 | |
| | | | 438/612 | |
| 2008/0224283 A1* | 9/2008 | Pu | H01L 23/3107 | |
| | | | 257/673 | |
| 2009/0130801 A1* | 5/2009 | Fukuda | H01L 23/495 | |
| | | | 438/123 | |
| 2009/0215230 A1* | 8/2009 | Muto | H01L 23/49562 | |
| | | | 438/124 | |
| 2010/0000772 A1* | 1/2010 | Letterman, Jr. | H01L 24/37 | |
| | | | 174/260 | |
| 2012/0080781 A1* | 4/2012 | Li | H01L 23/49551 | |
| | | | 257/676 | |
| 2012/0228696 A1* | 9/2012 | Carpenter | H01L 24/41 | |
| | | | 257/329 | |
| 2014/0203291 A1* | 7/2014 | Nakamura | H01L 23/49541 | |
| | | | 257/76 | |
| 2015/0001692 A1* | 1/2015 | Tsai | H01L 24/37 | |
| | | | 257/666 | |
| 2015/0371960 A1* | 12/2015 | Yap | H01L 24/09 | |
| | | | 257/659 | |
| 2016/0268190 A1* | 9/2016 | McKnight-MacNeil | H01L 21/78 | |
| 2017/0221728 A1* | 8/2017 | Ho | H01L 23/5389 | |
| 2018/0040541 A1* | 2/2018 | Choi | H01L 23/49568 | |
| 2018/0151478 A1* | 5/2018 | Chen | H01L 24/94 | |
| 2021/0272923 A1* | 9/2021 | Ryu | H01L 24/40 | |

* cited by examiner

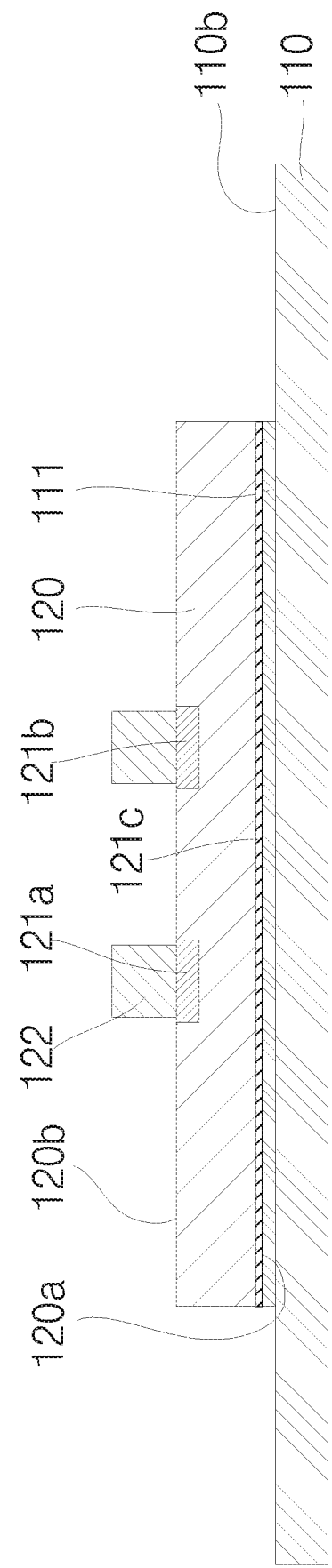

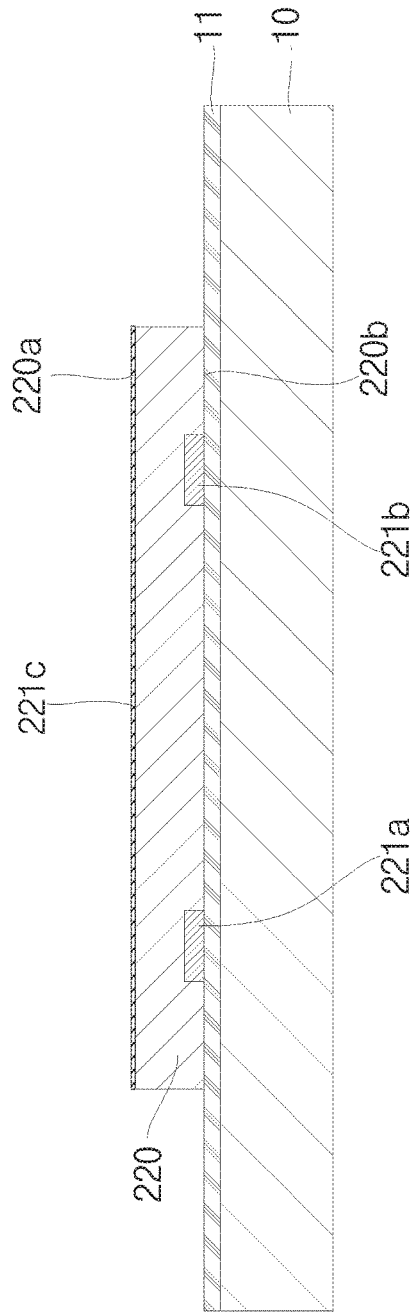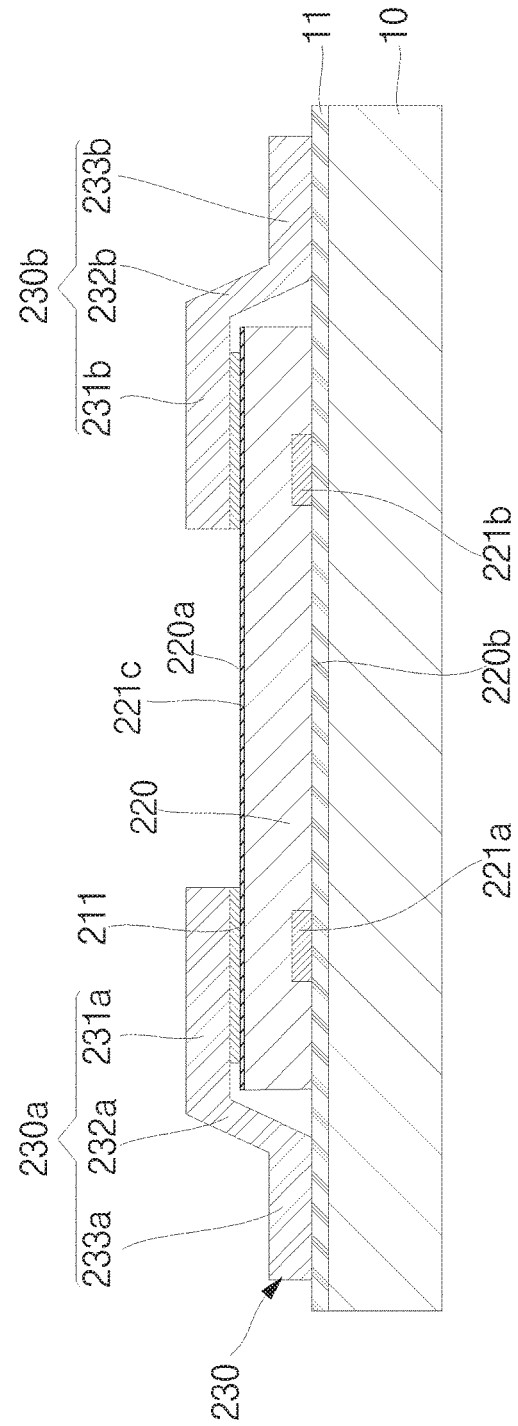

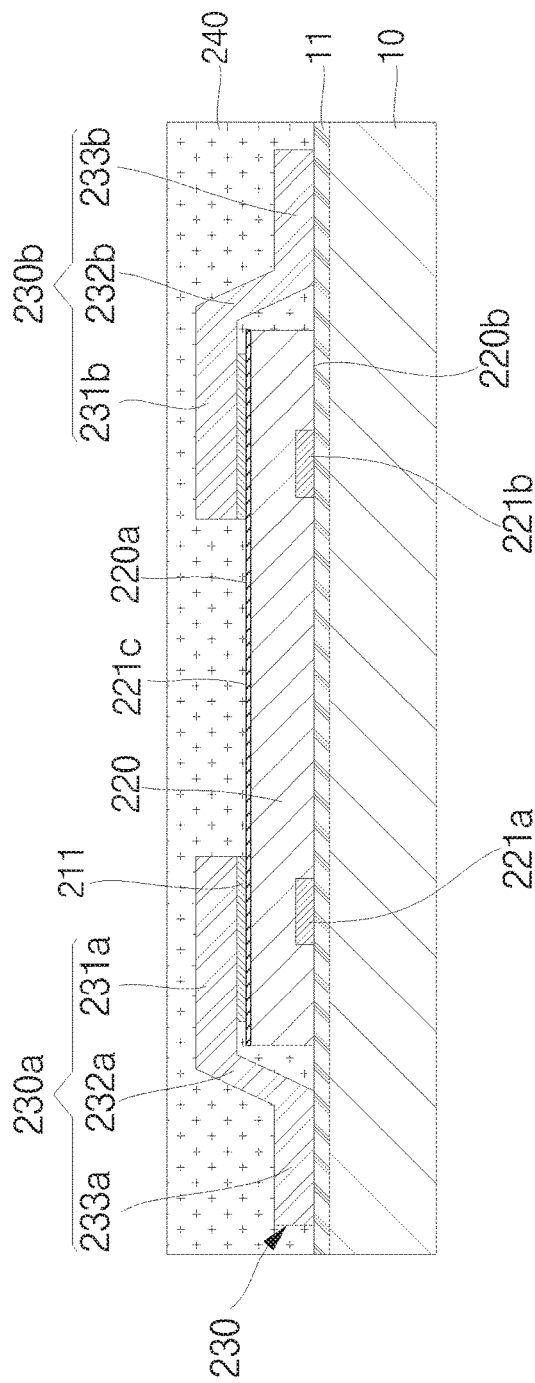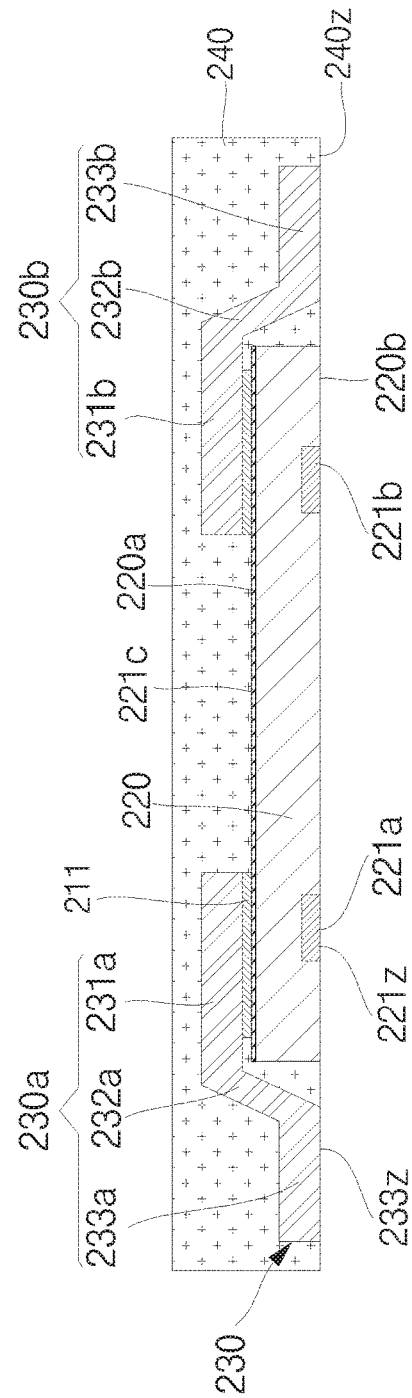

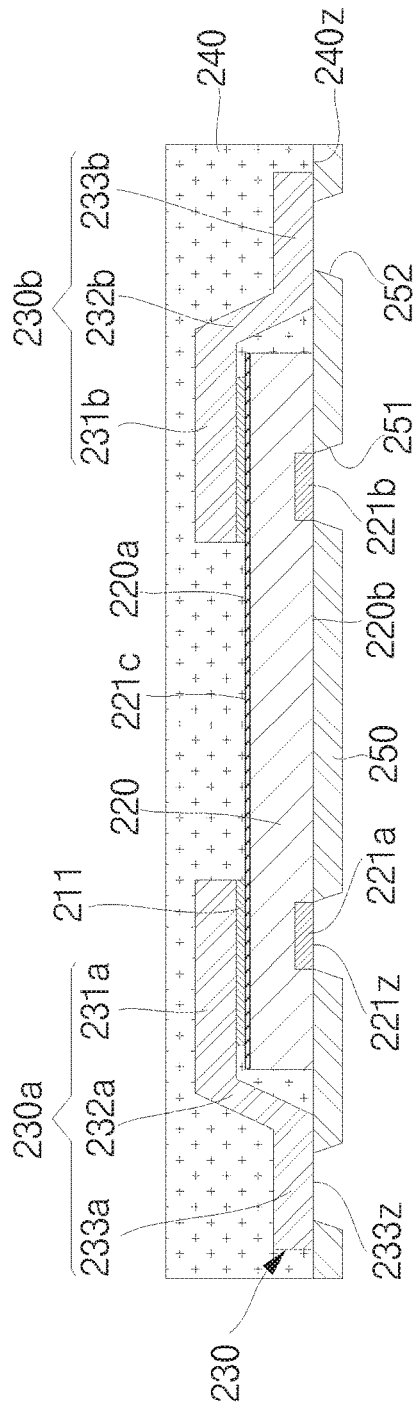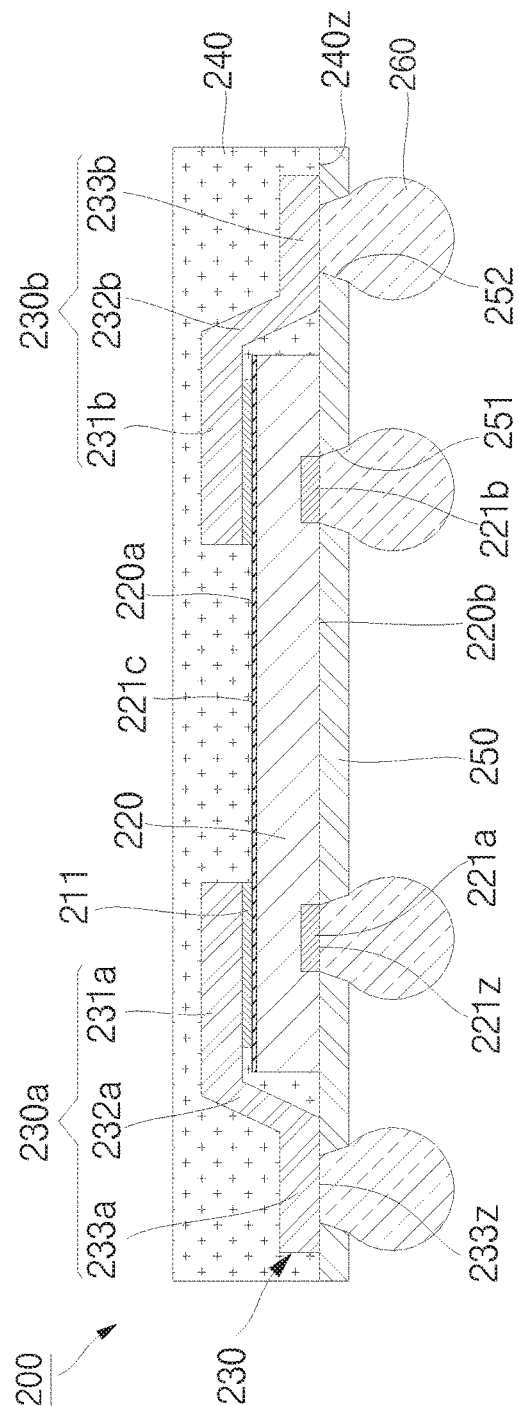
FIG. 4E
FIG. 4F

SEMICONDUCTOR DEVICE AND METHODS OF MANUFACTURING SEMICONDUCTOR DEVICES

CROSS-REFERENCE TO RELATED APPLICATIONS

Not applicable.

TECHNICAL FIELD

The present disclosure relates, in general, to electronic devices, and more particularly, to semiconductor devices and methods for manufacturing semiconductor devices

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A, 2B, 2C, 2D, 2E, 2F and 2G show cross-sectional views of an example method for manufacturing an example semiconductor device.

FIGS. 4A, 4B, 4C, 4D, 4E, and 4F show cross-sectional views of an example method for manufacturing an example semiconductor device.

Figure 1:
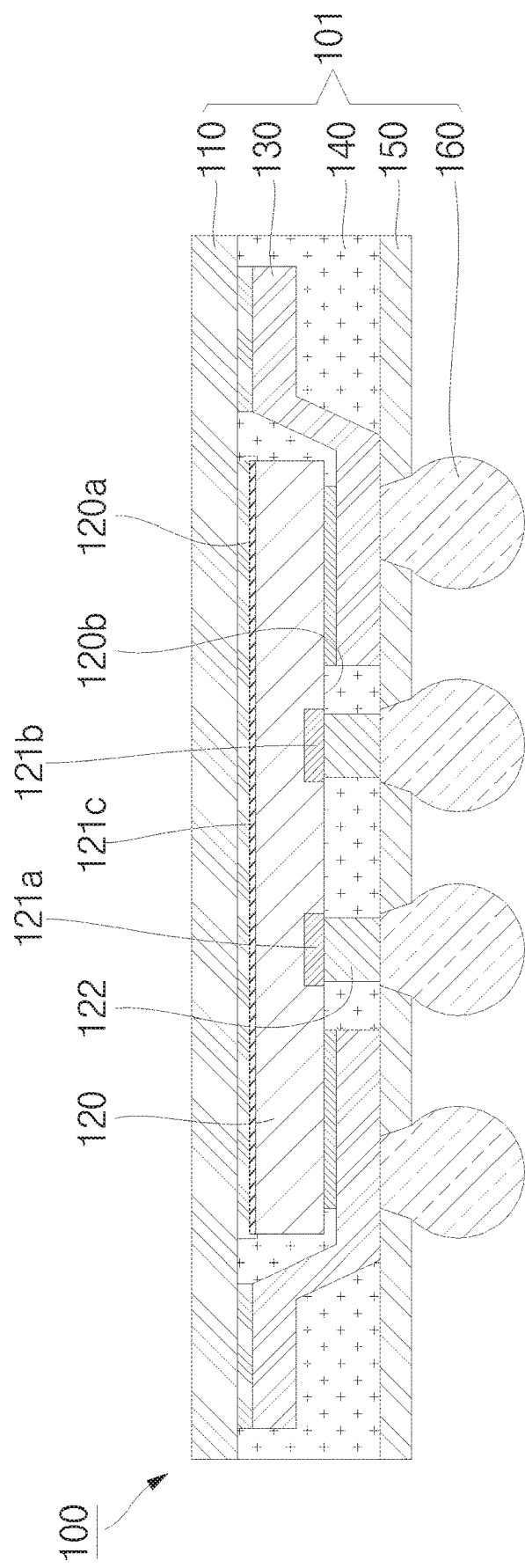
FIG. 1 illustrates a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), z), (x, y, z)}.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

The present description includes, among other features, an electronic device and associated methods that include a clip structure connected to an electronic component. The electronic component includes a component port with a component face and the clip structure includes a clip face. An encapsulant covers the electronic component, the component port, and the clip structure. The encapsulant includes an encapsulant face; and the clip face and the component port face are exposed from the encapsulant face. In some examples, the component port comprises a component terminal. In other examples, the component port comprises a component terminal and a component interconnect. In some examples, the clip structure includes a first clip pad and a second clip pad interconnected to the first clip pad. In some examples, the first clip pad is connected to the electronic component. In some example, the first clip pad comprises the first clip face. In other examples, the second clip pad comprises the first clip face. Among other things, the device and methods provide for electrical interconnection on one side of the electronic device.

In an example, a semiconductor device comprises an electronic component comprising a component face side, a component base side, a component lateral side connecting the component face side to the component base side, and a component port adjacent to the component face side. A clip structure is coupled to the electronic component, and an encapsulant covers portions of the electronic component and the clip structure. The component port comprises a component port face, the encapsulant comprises an encapsulant face, the clip structure comprises a first clip face, and the component port face and the first clip face are exposed from the encapsulant face.

In an example, a semiconductor device comprises a electronic component comprising a component face side, a component base side, a component lateral side connecting the component face side to the component base side, and a component port adjacent to the component face side, wherein the component port comprises a component port face. A clip structure comprises a first clip pad, a second clip pad, a first clip leg connecting the first clip pad to the second clip pad, and a first clip face. An encapsulant covers portions of the electronic component and the clip structure. The encapsulant comprises an encapsulant face, the first clip pad is coupled to the electronic component, and the component port face and the first clip face are exposed from the encapsulant face.

In an example, a method for forming a semiconductor device comprises providing an electronic component comprising a component face side, a component base side, a component lateral side connecting the component face side to the component base side, and a component port adjacent to the component face side, wherein the component port comprises a component port face. The method includes providing a clip structure having a first clip face and coupling the clip structure to the electronic component. The method includes providing an encapsulant covering portions of the electronic component and the clip structure, where the encapsulant comprises an encapsulant face, and the component port face and the first clip face are exposed from the encapsulant face.

Other examples are included in the present disclosure. Such examples may be found in the figures, in the claims, and/or in the description of the present disclosure.

FIG. 1 illustrates a cross-sectional view of an example semiconductor device 100. In the example shown in FIG. 1, semiconductor device 100 can comprise plate 110, electronic component 120, clip structure 130, encapsulant 140, dielectric 150 and external interconnects 160.

Electronic component 120 can comprise component base side 120a and component face side 120b. Electronic component 120 can comprise component terminals 121a,121b, 121c, and component interconnects 122. In some examples, component terminals 121a,121b,121c, together with respective component interconnects 122, can be referred as component ports. In some examples, component interconnects 122 can be referred as component ports.

Plate 110, clip structure 130, encapsulant 140, dielectric 150 and external interconnects 160 can comprise or be referred to as semiconductor package 101 and can provide protection for electronic component 120 from external elements and/or environmental exposure. Semiconductor package 101 can provide electrical coupling between an external component and electronic component 120.

FIGS. 2A, 2B, 2C, 2D, 2E, 2F and 2G show cross-sectional views of an example method for manufacturing an example semiconductor device 100.

FIG. 2A illustrates a cross-sectional view at an early stage of manufacture of semiconductor device 100. In the example shown in FIG. 2A, plate 110 can be substantially planar and can comprise or be referred to as a conductive plate or a heat dissipating plate. In some examples, plate 110 can be made of a material such as copper material (copper or an alloy having copper and another element such as nickel (Ni), silicon (Si), phosphorous (P) or titanium (Ti)), an iron-nickel alloy, or a Copper/Stainless Steel/Copper clad metal). To prevent plate 110 from being corroded, gold (Au), silver (Ag), tin (Sn), nickel (Ni) or palladium (Pd) can be partially or entirely plated on side of plate 110. In some examples, the thickness of plate 110 can range from about 3 μm (micrometer) to about 2000 μm, or the width of plate 110 can range from about 0.5 mm (millimeter) to about 10 mm.

FIG. 2B illustrates a cross-sectional view at a later stage of manufacture of semiconductor device 100. In the example shown in FIG. 2B, electronic component 120 comprising component interconnects 122 can be attached to top side 110b of plate 110.

In some examples, electronic component 120 can comprise or be referred to as a semiconductor die, a semiconductor chip, or a semiconductor package. In some examples, electronic component 120 can comprise a power device or a transistor device, such as a Field-Effect-Transistor (FET) device. In some examples, electronic component 120 can comprise active or passive electrical circuitry. In some examples, electronic component 120 can comprise one or more transistors, a digital signal processor (DSP), a microprocessor, a network processor, a power management processor, an audio processor, an RF circuit, a wireless baseband system-on-chip (SoC) processor, a sensor, an optical or light sensor, a transmitter, a wireless, optical, or light transmitter, or an application specific integrated circuit (ASIC). In some examples, electronic component 120 can comprise a silicon substrate or a glass substrate. In some examples, the thickness of electronic component 120 can range from about 30 μm to about 780 μm, or the width of electronic component 120 can range from about 0.5 mm to about 10 mm. Electronic component 120 can have component base side 120a and component face side 120b opposite each other.

Electronic component 120 can comprise component terminal 121c at component base side 120a. In some examples, component terminal 121c can be configured for receiving or transmitting signals or power. In some examples, component terminal 121c can comprise or be referred to as a source terminal or a drain terminal of electronic component 120. In some examples, component terminal 121c can comprise a component base or surface of electronic component 120 at component base side 120a.

Electronic component 120 can comprise component terminals 121a,121b provided on component face side 120b. Component terminals 121a,121b can comprise signal or power terminals of electronic component 120, and can comprise or be referred to as component face terminals, pads, under-bump-metallizations (UBMs), or bumps. Component terminals 121a,121b can comprise one or more layers of conductive material, such as aluminum, copper, or tin. In some examples, component terminal 121b can comprise or be referred to as a drain terminal or a source terminal of electronic component 120. In some examples, component terminal 121a can comprise or be referred to as a gate or control terminal of electronic component 120. In some examples, the widths of component terminals 121 can range from about 0.01 mm to about 1 mm.

Component interconnects 122 can be provided on or coupled with component terminals 121. Component interconnects 122 can extend upwardly from component terminals 121. In some examples, the heights of component interconnects 122 can range from about 0.05 mm to about 2 mm. In some examples, component interconnects 122 can be provided by electroplating, electroless plating, sputtering, physical vapor deposition (PVD), chemical vapor deposition (CVD), metalorganic CVD (MOCVD), atomic layer deposition (ALD), low pressure CVD (LPCVD) or plasma-enhanced CVD (PECVD). In some examples, component interconnects 122 can comprise wirebonded wires extending substantially vertically. In some examples, component interconnects 122 can comprise one or more of copper, gold, silver, palladium, tungsten or nickel material. Component interconnects 122 can comprise or be referred to as bumps, pillars, vertical wires, posts or conductive paths. In some examples, component interconnects 122 can electrically and mechanically connect external interconnects 160 to electronic component 120.

Component base side 120a of electronic component 120 can be bonded to top side 110b of plate 110 by interface material 111. In some examples, electronic component 120 can be picked up by pick-and-place equipment and placed on interface material 111 positioned on plate 110. In some examples, interface material 111 can be applied first to electronic component 120 and, and then electronic component 120 can be coupled to plate 110 through interface material 111. In some examples electronic component 120 can be electrically or thermally coupled to plate 110, through interface material 111, using a mass reflow process, a thermal compression process or a laser assist bonding process.

In some examples, interface material 111 can be provided on top side 110b of plate 110, or on component base side 120a, using a coating process, such as spin coating, doctor blade coating, spray coating; a printing process, such as screen printing, jet printing; or direct attachment of a film or tape. Interface material 111 can comprise or be referred to as an adhesive, a paste, a solder; an electrical conductor, or a heat conductor material. In some examples, Interface material 111 can comprise copper, iron, nickel, gold, silver, palladium or tin. Interface material 111 can electrically or thermally connect component base side 120a of electronic component 120 to plate 110.

Figure 2C:
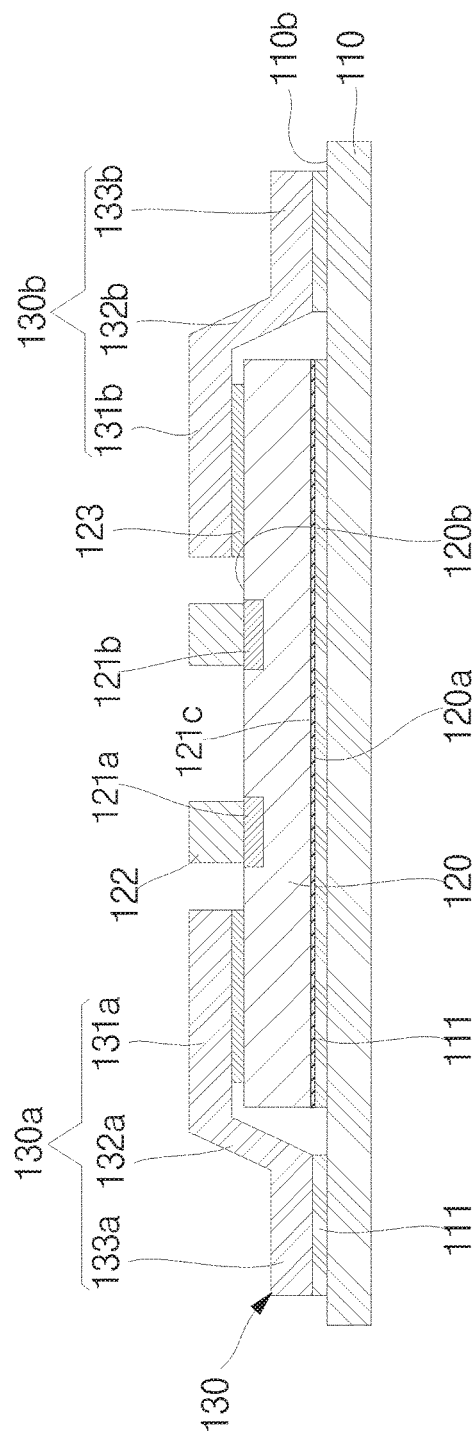

FIG. 2C illustrates a cross-sectional view at a later stage of manufacture of semiconductor device 100. In the example shown in FIG. 2C, plate 110 and component terminal 121c at component face side 120b of electronic component 120 can be connected through clip structure 130.

In some examples, clip structure 130 can comprise clip 130a or clip 130b. Clip structure 130a can comprise clip pad 131a that is coupled to component face side 120b of electronic component 120, and clip leg 132a that is coupled to and extends between clip pad 131a and top side 110b of plate 110. In some examples, clip leg 132a can comprise or can be coupled to clip pad 133a that is coupled to top side 110b of plate 110. In some examples, a surface of clip pad 131a coupled to component face side 120b can be substantially parallel to component face side 120b. In some examples, a surface of clip pad 133a coupled to plate 110 can be substantially parallel to top side 110b of plate 110. In some examples, clip leg 132a can extend diagonally from clip pad 133a towards plate 110 or clip pad 133a. In some examples, clip 130b can comprise respective clip pad 131b, clip leg 132b, or clip pad 133b.

In some examples, clip structure 130 can be provided by bending or etching one or more conductive plates. In some examples, clip structure 130 can comprise part of a leadframe. In some examples, clip structure 130 can be made of a copper material (copper or an alloy having copper and another element such as Ni, Si, P, or T), an iron-nickel material, or a Cu/SUS/Cu clad metal. In some examples, the thickness of clip structure 130 can range from about 0.05 mm to about 2 mm.

In some examples, interface material 111 can be applied on top side 110b of plate 110, and bond material 123 can be applied on component face side 120b of electronic component 120. Clips 130a,130b of clip structure 130 can be positioned such that clip pad 131a,131b couples with bond material 123 to bond with component face side 120b of electronic component 120, and such that clip leg 132a,132b or clip pad 133a,133b couples with interface material 111 to bond with plate 110. In some examples, clip pad 131a,131b can be attached at a periphery or edge of component face side 120b. In some examples, clip leg 132a,132b can be coupled on top side 110b of plate 110 adjacent a lateral side of electronic component 120.

In some examples, bond material 123 can comprise or be referred to an electrically insulating material. In some examples, bond material 123 can comprise or be referred to as a heat-conductive material. In some examples, bond material 123 can comprise or be referred to as an adhesive, a paste, or a solder. Clip structure 130 can be electrically, thermally or mechanically connected to plate 110 through interface material 111. Clip structure 130 can be mechanically or thermally connected to component face side 120b of electronic component 120 through bond material 123. Clip structure 130 can be electrically isolated from component face side 120b of electronic component 120 in some implementations. For example, bond material 123 can comprise an electrically insulating material between clip pad 131a, 131b and component face side 120b of electronic component 120. As another example, bond material 123 can comprise an electrically conductive material, but does not contact any exposed terminal of semiconductor device 120 between clip pad 131a,131b and component face side 120b of electronic component 120.

Figure 2D:
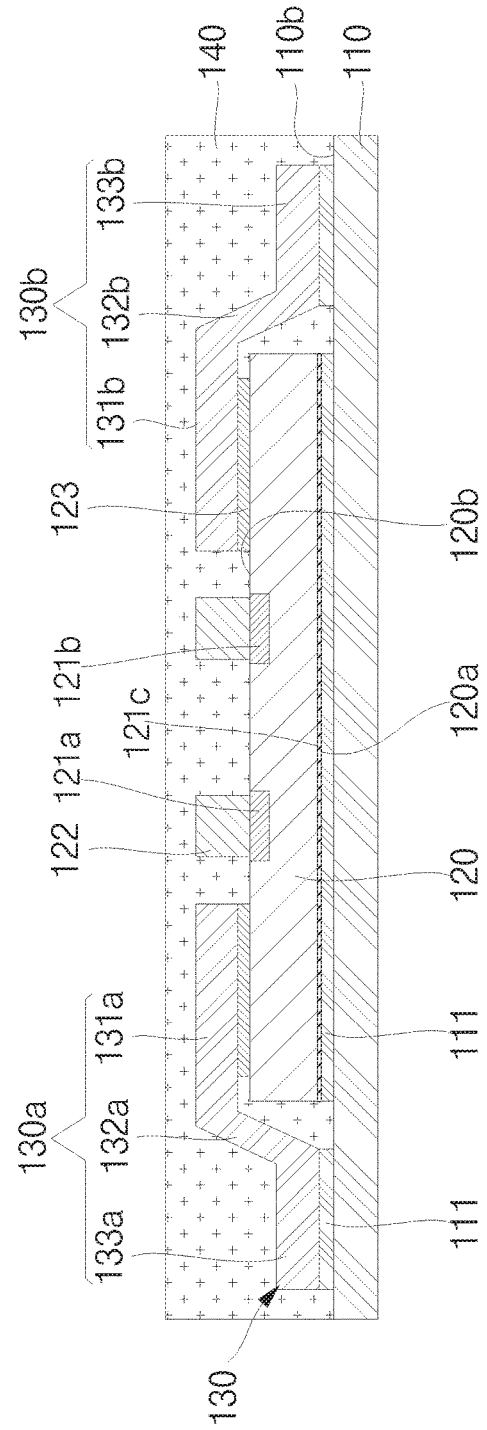

FIG. 2D illustrates a cross-sectional view at a later stage of manufacture of semiconductor device 100. In the example shown in FIG. 2D, encapsulant 140 can cover plate 110, electronic component 120 and clip structure 130. In some examples, encapsulant 140 can contact top side 110b of plate 110. In some examples, encapsulant 140 can contact component face side 120b or lateral sides of electronic component 120. In some examples, encapsulant 140 can contact top sides or lateral sides of component interconnects 122. In some examples, encapsulant 140 can contact top or lateral sides of clip structure 130. In some examples, encapsulant 140 can extend between clip structure 130 and lateral sides of electronic component 120.

In some examples, encapsulant 140 can comprise or be referred to as an epoxy molding compound, an epoxy molding resin or a sealant. In some examples, encapsulant 140 can comprise or be referred to as a molding part, a sealing part, an encapsulation part, a protection part, or a package body. In some examples, encapsulant 140 can comprise, an organic resin, an inorganic filler, a curing agent, a catalyst, a coupling agent, a coloring agent, and a flame retardant. Encapsulant 140 can be provided by a variety of processes. In some examples, encapsulant 140 can be provided by, a compression molding process, a liquid phase encapsulant molding process, a vacuum lamination process, a paste printing process, or a film assisted molding process. The thickness of encapsulant 140 can range from approximately 0.08 mm to approximately 3 mm. Encapsulant 140 can cover plate 110, electronic component 120 and clip structure 130 to protect plate 110, electronic component 120 and clip structure 130 from external elements and/or environmental exposure.

Figure 2E:
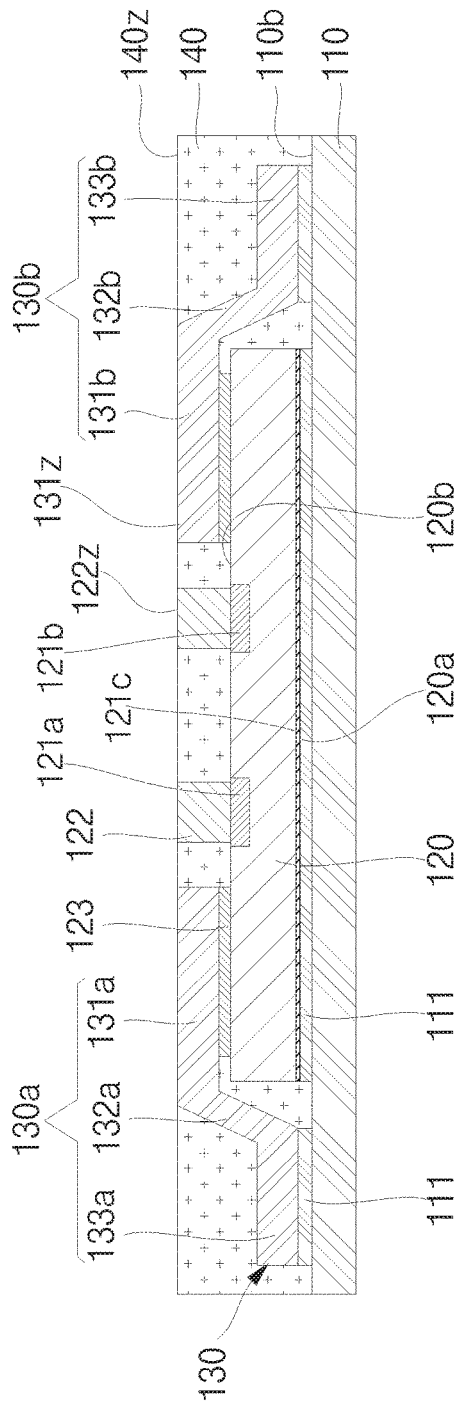

FIG. 2E illustrates a cross-sectional view at a later stage of manufacture of semiconductor device 100. In the example shown in FIG. 2E, a portion of encapsulant 140 can be removed to expose face 122z of component interconnects 122, and face 131z of clip pads 131a,131b of clip structure 130, from encapsulant 140. Encapsulant 140 can be removed by grinding or chemical etching. In some examples, side 140z of encapsulant 140 can be coplanar with face 122z of component interconnects 122 and face 131z of clip pad 131a,131b. In some examples, the thickness of encapsulant 140 having the top portion removed can range from about 0.08 mm to about 3 mm.

Figure 2F:
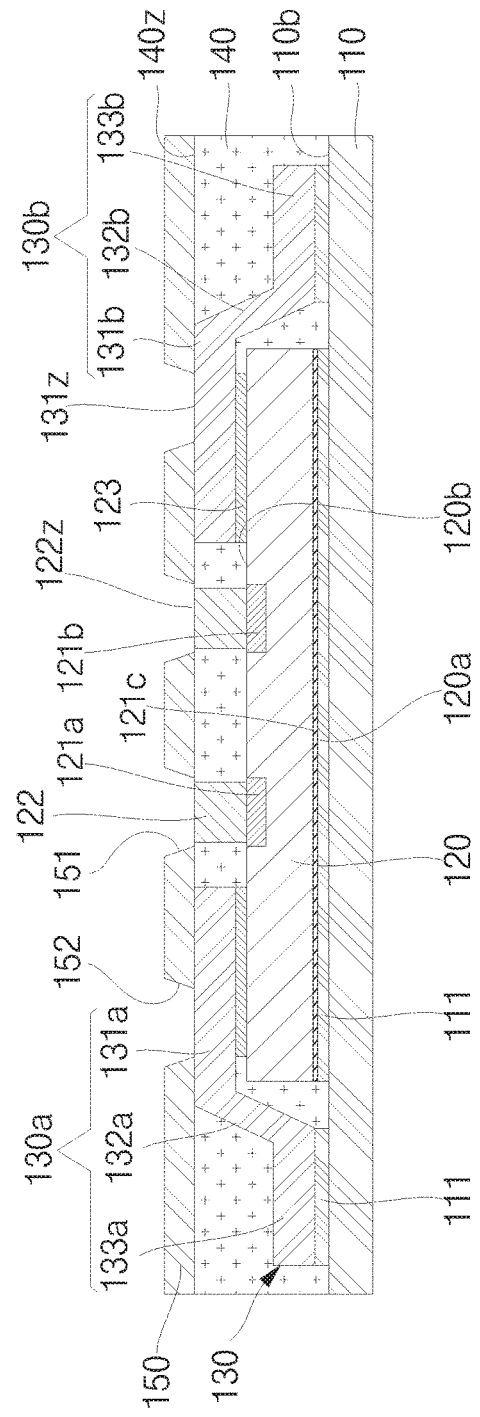

FIG. 2F illustrates a cross-sectional view at a later stage of manufacture of semiconductor device 100. In the example shown in FIG. 2F, dielectric 150 can be provided to cover top side 140z of encapsulant 140, face 122z of component interconnects 122 and face 131z of clip pad 131a,131b of clip structure 130.

Dielectric 150 can comprise or be referred to as a dielectric layer, a passivation layer, an insulation layer or a protection layer. In some examples, dielectric 150 can comprise, an electrically insulating material, such as a polymer, polyimide (PI), benzocyclobutene (BCB), polybenzoxazole (PBC)), bismaleimide triazine (BT), a molding material, a phenolic resin, an epoxy, silicone, or an acrylate polymer. In some examples, dielectric 150 can be provided by any of a variety of processes. For example, dielectric 150 can be provided by spin coating, spray coating, printing, PVD, CVD, MOCVD, ALD, LPCVD or PECVD. The thickness of dielectric 150 can range from about 2 μm to about 30 μm.

Apertures 151 and 152 exposing face 122z of component interconnects 122 and face 131z of clip pad 131a,131b can be provided on dielectric 150. In some examples, apertures 151 and 152 can be formed by patterning a mask on a top side of dielectric 150 and then exposed dielectric 150 can be removed by etching to expose, face 122z of component interconnects 122 and face 131z of clip pad 131a,131b. Face 122z of component interconnects 122 or face 131z of clip pad 131a,131b exposed through apertures 151 and 152 can be circular, rectangular or polygonal in some examples.

Figure 2G:
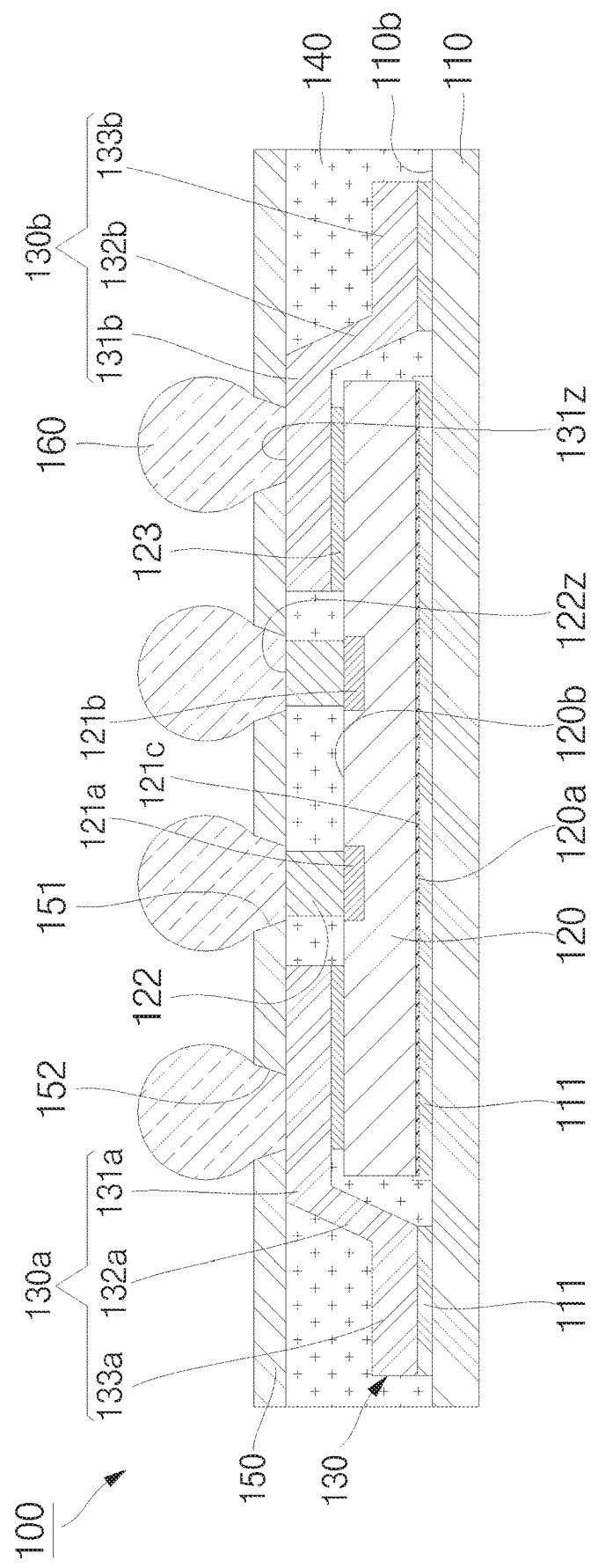

FIG. 2G illustrates a cross-sectional view at a later stage of manufacture of semiconductor device 100. In the example shown in FIG. 2G, external interconnects 160 can be provided on face 122z of component interconnects 122, or on face 131z of clip pad 131a,131b. External interconnects 160 can be electrically connected to face 122z of component interconnects 122, or to face 131z of clip pad 131a,131b. External interconnects 160 can be electrically connected to component terminal 121c at component base side 120a of electronic component 120 through clip structure 130 and plate 110, or can be electrically connected to component terminals 121a,121b of electronic component 120 through component interconnects 122.

In some examples, external interconnects 160 can comprise tin (Sn), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. For example, external interconnects 160 can be provided by a ball drop process, a screen printing process or an electroplating process. For example, external interconnects 160 can be provided by applying a conductive material including a solder to face 122z of component interconnects 122 and face 131z of clip pad 131 through a ball drop process, followed by performing a reflow process. External interconnects 160 can be referred to as conductive balls, such as solder balls, conductive pillars, such as copper pillars, or conductive posts having solder caps on copper pillars. The sizes of external interconnects 160 can range from about 50 mm to about 700 mm. Additionally, completed semiconductor device 100 can be flipped, so external interconnects 160 are positioned on bottom side of semiconductor device 100. In some examples, external interconnects 160 can be referred to as external input/output terminals of semiconductor device 100.

Figure 3:
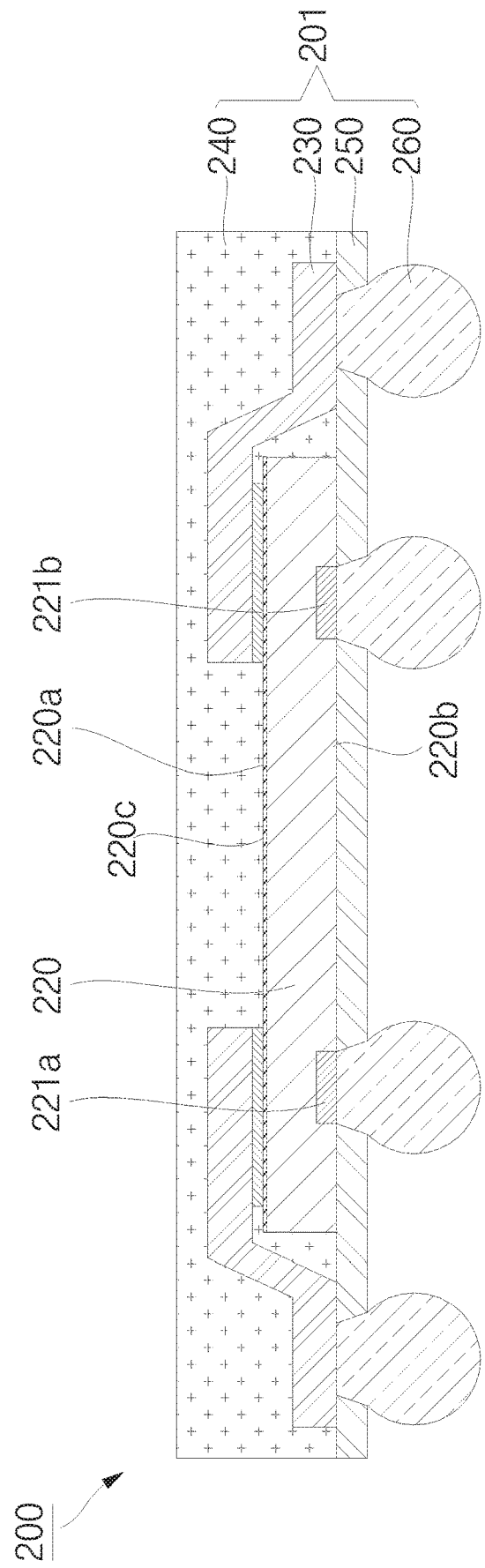
FIG. 3 illustrates a cross-sectional view of an example semiconductor device.

FIG. 3 illustrates a cross-sectional view of an example semiconductor device 200. In the example shown in FIG. 3, semiconductor device 200 can comprise electronic component 220, clip structure 230, encapsulant 240, dielectric 250 and external interconnects 160.

Electronic component 220 can comprise component base side 220a and component face side 220b. Electronic component 220 can include component ports comprising component terminals 221a,221b,221c.

Clip structure 230, encapsulant 240, dielectric 250 and external interconnects 160 can comprise or be referred to as semiconductor package 201 or package 201, and can provide protection for electronic component 220 from external elements and/or environmental exposure. Semiconductor package 201 can provide electrical coupling between an external component and electronic component 220. Semiconductor device 200 is an example of device where encapsulant 240 is interposed between a component lateral side of electronic component 220, clip pad 233a or clip pad 233b.

FIGS. 4A, 4B, 4C, 4D, 4E, and 4F show cross-sectional views of an example method for manufacturing an example semiconductor device 200.

FIG. 4A illustrates a cross-sectional view of semiconductor device 200 at an early stage of manufacture. In the example shown in FIG. 4A, electronic component 220 can be attached on carrier 10.

Electronic component 220 can comprise component base side 220a and component face side 220b opposite to component base side 220a. Component base side 220a can comprise component terminal 221c, and component face side 220b can comprise component terminals 221a,221b. Electronic component 220 and its features or elements be similar to electronic component 120 and its respective features or elements. Electronic component 220 can be positioned with component face side 220b and component terminals 221 bonded to carrier 10.

Carrier 10 can be a substantially planar plate. For example, carrier 10 can comprise or be referred to as a board, a wafer, a panel, or a strip. In some examples, carrier 10 can comprise, steel, stainless steel, aluminum, copper, ceramic, silicon, or glass. The thickness of carrier 10 can range from 100 mm to 780 mm, and the width of carrier 10 can range from 200 mm to 300 mm. Carrier 10 can function for attachment of electronic component 220 and clip structure 230, and can simultaneously handle formation of multiple semiconductor devices in an array format.

Carrier 10 can comprise adhesive 11, applied prior to attachment of electronic component 220. Adhesive 11 can comprise or be referred to as a temporary adhesive film or a temporary adhesive tape. In some examples, adhesive 11 can comprise a thermally releasable tape (film) or a photo-releasable tape (film). In some examples, adhesiveness of and can be weakened or removed by heat or light. In some examples, the adhesiveness of adhesive 11 can be weakened or removed by physical and/or chemical external force. The thickness of adhesive 11 can range from about 5 μm to about 100 μm.

FIG. 4B illustrates a cross-sectional view at a later stage of manufacture of semiconductor device 200. In the example shown in FIG. 4C, clip structure 230 can be provided coupled between electronic component 220 and carrier 10.

Clip structure 230 can be similar to clip structure 130 and its corresponding features or elements described in the present disclosure. Clip structure 230 can comprise clip 230a having clip pad 231a coupled to component base side 220a of electronic component 220, and having clip leg 232a coupled to and extended between clip pad 231a and carrier 10. In some examples, clip leg 232a can comprise or can be coupled to clip pad 233a that is coupled to carrier 10. In some examples, a surface of clip pad 231a coupled to component base side 220a can be substantially parallel to component base side 220a. In some examples, a surface of clip pad 233a coupled to carrier 10 can be substantially parallel to carrier 10. In some examples, clip leg 232a can extend diagonally from clip pad 231a towards carrier 10 or clip pad 233a. In some examples, clip structure 230 can comprise clip 230b with respective clip pad 231b, clip leg 232b, or clip pad 233b.

In some examples, interface material 211 can be applied on component base side 220a of electronic component 220. In some examples, interface material 211 can be similar to, or can be similarly formed or applied, as interface material 111 previously described with respect to FIGS. 1-2. Interface material can electrically or thermally couple clip structure 230 to component terminal 221c at component base side 220a of electronic component 220. Clips 230a,230b of clip structure 230 can be positioned such that clip pad 231a,231b couples to interface material 211 to bond with component base side 220a of electronic component 220, and such that clip leg 232a,232b or clip pad 233a,233b couples to adhesive 11 to bond with carrier 10. In some examples, clip pad 231a,231b can be attached at a periphery or edge of component base side 220a. In some examples, clip leg 232a, 232b can be coupled to carrier 10 adjacent a lateral side of electronic component 220.

FIG. 4C illustrates a cross-sectional view at a later stage of manufacture of semiconductor device 200. In the example shown in FIG. 4C, encapsulant 240 can cover electronic component 220 and clip structure 230. In some examples, encapsulant 240 can contact component base side 220a or lateral sides of electronic component 220. In some examples, encapsulant 240 can contact top or lateral sides of clip structure 230, or can be positioned between clip structure 230 and lateral sides of electronic component 220. Encapsulant 240 can be similar to, or can be similarly formed or applied as, encapsulant 140.

FIG. 4D illustrates a cross-sectional view of semiconductor device 200 at a later stage of manufacture. In the example shown in FIG. 4D, carrier 10 can be removed. Adhesive 11 can be released from electronic component 220, clip structure 230 and encapsulant 240 in a state where it remains bonded to carrier 10. In some examples, heat, light, a chemical solution and/or physical external force can be applied to remove or reduce adhesiveness of adhesive 11. With carrier 10 removed, component face side 220b of electronic component 220, face 221z of component terminals 221a,221b of electronic component 220, face 233z of clip pad 233a,233b of clip structure 230, or side 240z of encapsulant 240 can be exposed.

FIG. 4E illustrates a cross-sectional view at a later stage of manufacture of semiconductor device 200. In the example shown in FIG. 4E, dielectric 250 can be provided to cover component face side 220b of electronic component 220, face 233z of clip pad 233a,233b of clip structure 230, and side 240z of encapsulant 240. Apertures 251,252 through dielectric 250 can expose face 221z of component terminals 221a,221b, and can expose face 233z of clip pad 233a,233b. Dielectric 250 can be similar to, and can be similarly formed as, dielectric 150.

FIG. 4F illustrates a cross-sectional view at a later stage of manufacture of semiconductor device 200. In the example shown in FIG. 4F, external interconnects 260 are provided on face 221z of component terminals 221a,221b, and on face 233z of clip pad 233a,233b. External interconnects 260 can be electrically connected to component base side 220a of electronic component 220 through clip structure 230. External interconnects 260 can be similar to, and can be similarly formed as, external interconnects 160.

Figure 5:
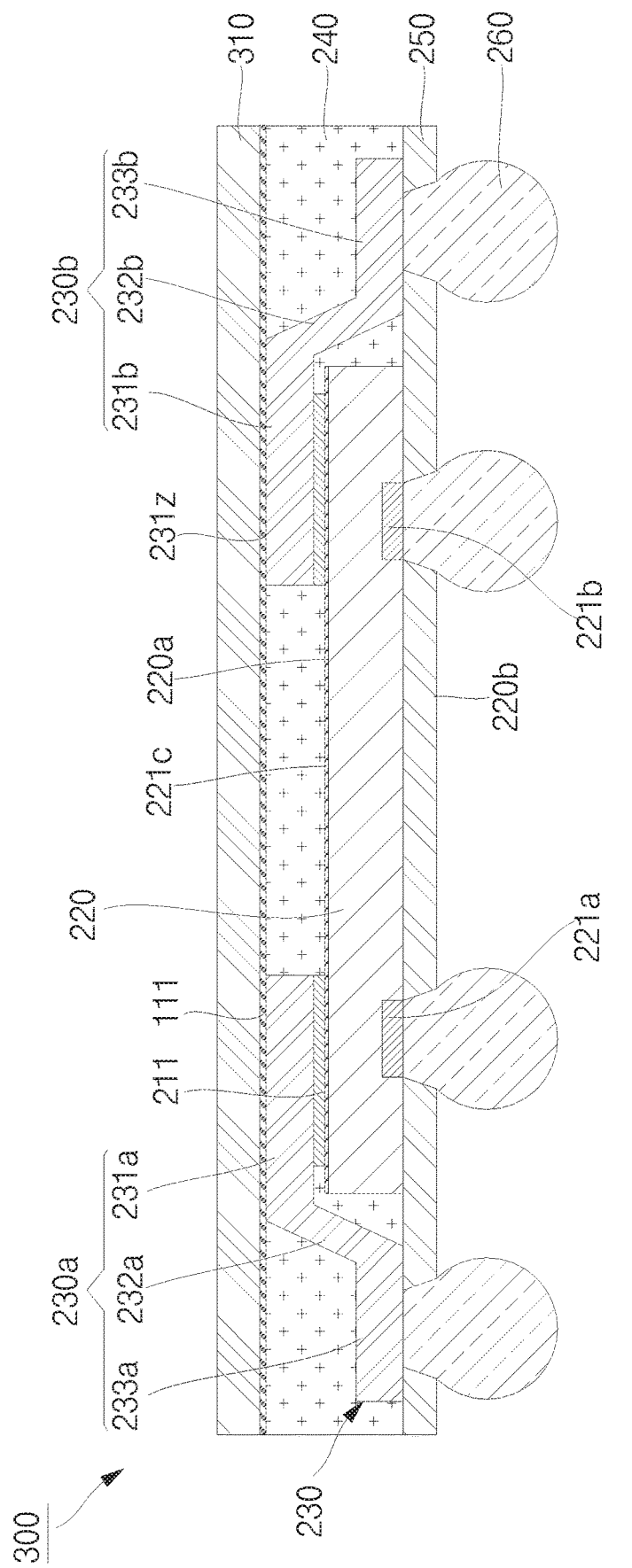
FIG. 5 illustrates a cross-sectional view of an example semiconductor device.

FIG. 5 illustrates a cross-sectional view of an example semiconductor device 300. In the example shown in FIG. 5, semiconductor device 300 can comprise plate 310, electronic component 220, clip structure 230, encapsulant 240, dielectric 250 and external interconnects 260.

Semiconductor device 300 can be similar to other semiconductor devices described in this disclosure in terms of structure or formation, such as semiconductor device 200 described in FIGS. 3-4. Semiconductor device 300 comprises plate 310 coupled to clip structure 230 at face 231z of clip pad 231a,231b. In some examples, plate 310 can be similar to plate 110 described with respect to FIGS. 1-2. In some examples, prior to coupling of plate 310, a portion of encapsulant 240 can be removed to expose face 231z of clip pad 231a,231b, similar to as described with respect to FIG. 2E. In some examples, plate 310 can be directly formed on or coupled with clip pad 231a,231b of clip structure 30 or with encapsulant 240. In some examples, plate 310 can couple with clip pad 231a,231b of clip structure 30 through interface material 111.

Figure 6:
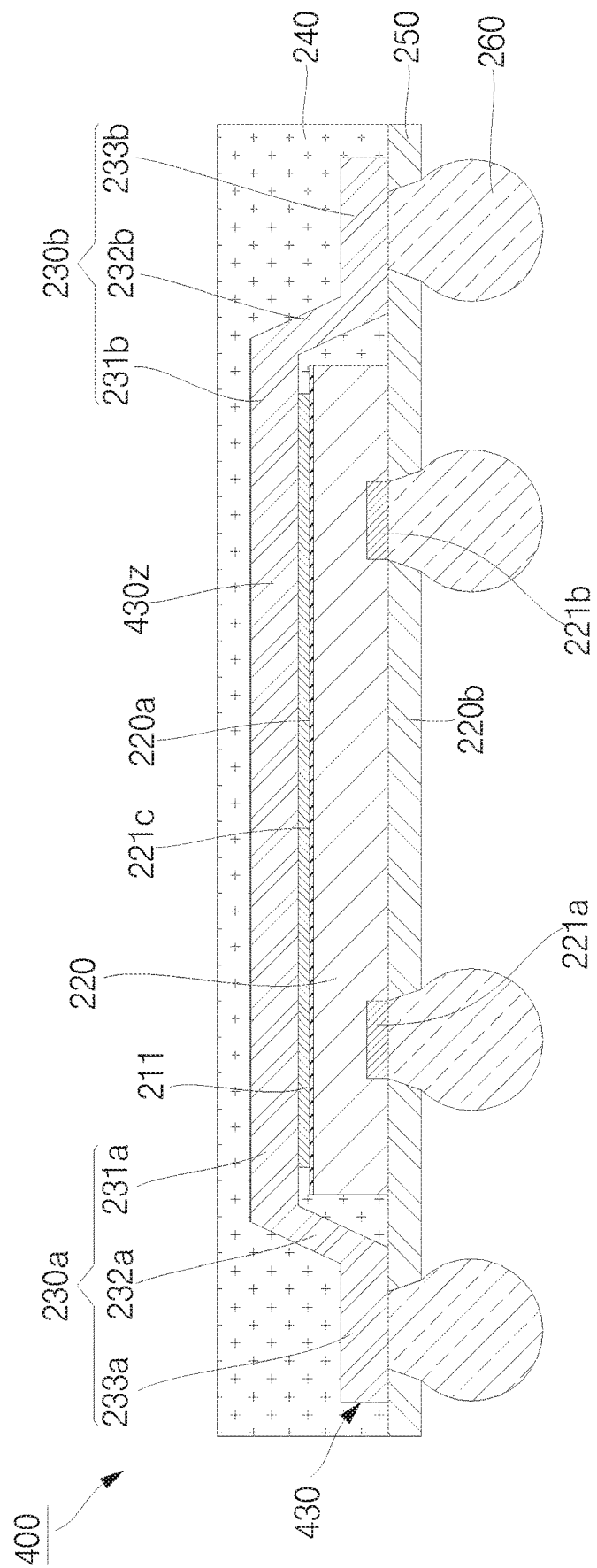
FIG. 6 illustrates a cross-sectional view of an example semiconductor device.

FIG. 6 illustrates a cross-sectional view of an example semiconductor device 400. In the example shown in FIG. 6, semiconductor device 400 can comprise electronic component 220, clip structure 430, encapsulant 240, dielectric 250 and external interconnects 160.

Semiconductor device 400 can be similar to other semiconductor devices described in this disclosure in terms of structure or formation, such as semiconductor device 200 described in FIGS. 3-4, or semiconductor device 300 described in FIG. 5

Clip structure 430 can be similar to clip structure 230 described in FIGS. 3-5 in terms of structure or formation, and comprises clip bridge 430z extending between clip legs 232a, 232b over component base side 220a. In some examples, clip bridge 430 can span an entire width of electronic component 220. In some examples, interface material 211 can couple bridge 430 with component terminal 221c at component base side 220a of electronic component 220. In some examples, interface material 211 can cover a majority of the width or area of component base side 220a.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:
1. A semiconductor device, comprising:
a semiconductor component comprising:
a component face side;
a component base side;
a component lateral side connecting the component face side to the component base side;
a component port adjacent to the component face side and comprising:
a first component terminal on the component face side; and
a first component interconnect coupled to the first component terminal; and
a second component terminal on the component base side;
a clip structure coupled to the component face side with a first interface material; and
an encapsulant covering portions of the semiconductor component and the clip structure;
wherein:
the first component interconnect comprises a component port face;
the encapsulant comprises a first encapsulant face and a second encapsulant face opposite to the first encapsulant face;
the clip structure comprises a first clip face and a second clip face; and the component port face and the first clip face are exposed from the first encapsulant face; and
the second clip face is electrically coupled to the second component terminal at the second encapsulant face.

2. The semiconductor device of claim 1, wherein:
the first interface material is electrically insulating; and
the first encapsulant face, the first clip face, and the component port face are substantially co-planar.

3. The semiconductor device of claim 1, wherein:
the clip structure comprises:
 a first clip pad having the first clip face;
 a second clip pad having the second clip face; and
 a first clip leg connecting the first clip pad and the second clip pad together.

4. The semiconductor device of claim 1 wherein:
the second clip face is coupled to the second component terminal with a conductive plate that overlaps the second clip face and the second component terminal.

5. The semiconductor device of claim 4, wherein:
the second clip face and the second component terminal are coupled to the conductive plate with a second interface material;
the second interface material is electrically conductive;
the second interface material is exposed from the second encapsulant face; and
outer surfaces of the second interface material are coplanar with the second encapsulant face.

6. The semiconductor device of claim 1, wherein:
the clip structure comprises:
 a first clip pad coupled to the semiconductor component and having the first clip face;
 a second clip pad having the second clip face;
 a first clip leg connecting the first clip pad and the second clip pad together;
 a third clip pad coupled to the semiconductor component;
 a fourth clip pad; and
 a second clip leg connecting the third clip pad and the fourth clip pad together.

7. The semiconductor device of claim 6, wherein:
the first clip pad is coupled to the component face side at a first peripheral edge of the semiconductor component;
the third clip pad is coupled to the component face side at a second peripheral edge of the semiconductor component; and
the encapsulant completely covers outer ends of the second clip face and the fourth clip face.

8. The semiconductor device of claim 1, further comprising:
a dielectric layer over the first encapsulant face and having apertures, wherein portions of the first clip face and the component port face are exposed within the apertures; and
external interconnects coupled to the first clip face and the component port face through the apertures.

9. The device of claim 1, wherein:
the second component terminal is a drain terminal.

10. A semiconductor device, comprising:
a semiconductor component comprising:
 a component face side;
 a component base side;
 a component lateral side connecting the component face side to the component base side;
 a component port adjacent to the component face side, wherein the comprises a component port face; and
 a first component terminal on the component base side;

a clip structure comprising:
 a first clip pad having a first clip face;
 a second clip pad having a second clip face; and
 a first clip leg connecting the first clip pad to the second clip pad;
and
an encapsulant covering portions of the semiconductor component and the clip structure;
wherein:
 the encapsulant comprises a first encapsulant face and a second encapsulant face opposite to the first encapsulant face;
 the first clip pad is coupled to the component face side with a first interface material;
 the first interface material is electrically insulating; and
 the component port face and the first clip face are exposed from the first encapsulant face.

11. The semiconductor device of claim 10, wherein:
the component port comprises a second component terminal and a component interconnect;
the component interconnect comprises the component port face;
the component port face and the first clip face are substantially co-planar; and
the first component terminal is one of a drain terminal or a source terminal.

12. The semiconductor device of claim 10, wherein:
the second clip face is electrically connected to first component terminal at the second encapsulant face.

13. The semiconductor device of claim 10, wherein:
the second clip pad has an outer end proximate to a side of the encapsulant; and
the outer end is completely covered by the encapsulant.

14. A method of forming a semiconductor device, comprising:
providing a semiconductor component comprising:
 a component face side;
 a component base side;
 a component lateral side connecting the component face side to the component base side;
 a component port adjacent to the component face side and comprising a first component terminal on the component face side; and a first component interconnect coupled to the first component terminal, wherein the first component interconnect comprises a component port face; and
 a second component terminal on the component base side;
providing a clip structure having a first clip face and a second clip face;
coupling the clip structure to the component face side with a first interface material;
providing an encapsulant covering portions of the semiconductor component and the clip structure;
wherein:
 the first interface material is electrically insulating;
 the second clip face has an outer end proximate to a side of the encapsulant;
 the encapsulant comprises a first encapsulant face and a second encapsulant face opposite to the first encapsulant face; and
 the component port face and the first clip face are exposed from the first encapsulant face; and
electrically coupling the second clip face to the second component terminal at the second encapsulant face.

15. The method of claim 14, further comprising:
providing a dielectric over the first encapsulant face; and providing apertures in the dielectric that expose portions of the first clip face and the component port face; and
providing external interconnects coupled to the first clip face and the component port face through the apertures.

16. The method of claim 12, wherein:
the covering includes completely covering the outer end of the second clip face.

* * * * *